United States Patent
Sakaray et al.

(10) Patent No.: US 11,787,387 B2
(45) Date of Patent: Oct. 17, 2023

(54) THERMAL MANAGEMENT SYSTEM FOR AN ENERGY STORAGE CONTAINER

(71) Applicant: Caterpillar Inc., Peoria, IL (US)

(72) Inventors: Umakanth Sakaray, Dunlap, IL (US);
John M. Tanner, Dunlap, IL (US);
Marvin Baer, Edelstein, IL (US);
Nirag Sheth, Peoria, IL (US);
Christopher Derham, Peoria, IL (US);
Jeremiah Raveling, Rapid City, SD (US)

(73) Assignee: Caterpillar Inc., Peoria, IL (US)

( * ) Notice: Subject to any disclaimer, the term of this patent is extended or adjusted under 35 U.S.C. 154(b) by 157 days.

(21) Appl. No.: 16/987,109

(22) Filed: Aug. 6, 2020

(65) Prior Publication Data

US 2022/0041153 A1 Feb. 10, 2022

(51) Int. Cl.
*B60W 10/30* (2006.01)
*H01M 10/625* (2014.01)
(Continued)

(52) U.S. Cl.
CPC ............. *B60W 10/30* (2013.01); *B60L 58/26* (2019.02); *H01M 10/625* (2015.04);
(Continued)

(58) Field of Classification Search
CPC ..... B60W 10/30; B60L 58/26; H01M 10/625; H01M 10/6568; H01M 2220/20; H05K 7/20218; H05K 7/202
See application file for complete search history.

(56) References Cited

U.S. PATENT DOCUMENTS

2002/0073726 A1* 6/2002 Hasebe ............... H01M 10/667
903/905
2009/0022206 A1* 1/2009 Shibuya ................. B60L 53/80
374/208
(Continued)

FOREIGN PATENT DOCUMENTS

DE 102011012723 A1 8/2018
DE 102017129777 A1 * 6/2019 ............. B60L 50/50
(Continued)

OTHER PUBLICATIONS

Spies et al., DE 102017129777 A1; Espacenet machine translation (Year: 2017).*
(Continued)

*Primary Examiner* — Adam A Arciero
(74) *Attorney, Agent, or Firm* — Bookoff McAndrews, PLLC

(57) ABSTRACT

A thermal management system for an energy storage container includes an enclosed compartment containing an energy storage unit, an air temperature control unit configured to cool an interior of the enclosed compartment, and at least one inverter connected to a coolant circuit, which is separate from the air temperature control unit, and configured to be cooled by a coolant in the coolant circuit. The thermal management system also includes a radiator located outside of the enclosed compartment, the radiator being connected to the coolant circuit, wherein the coolant in the coolant circuit flows through the radiator, and at least one fan located alongside the radiator, outside of the enclosed compartment, the at least one fan being configured to blow air across the radiator to cool the coolant flowing through the radiator.

20 Claims, 3 Drawing Sheets

(51) Int. Cl.
    *H01M 10/6568*     (2014.01)
    *B60L 58/26*     (2019.01)
    *H05K 7/20*     (2006.01)

(52) U.S. Cl.
    CPC .... *H01M 10/6568* (2015.04); *H05K 7/20218* (2013.01); *H01M 2220/20* (2013.01)

(56) References Cited

U.S. PATENT DOCUMENTS

| | | | |
|---|---|---|---|
| 2015/0003015 A1* | 1/2015 | Kulkarni | H05K 7/20309 361/700 |
| 2015/0101355 A1 | 4/2015 | Oh et al. | |
| 2018/0154782 A1 | 6/2018 | Lee | |
| 2019/0039434 A1 | 2/2019 | Wallace | |
| 2019/0202283 A1 | 7/2019 | Plecko | |

FOREIGN PATENT DOCUMENTS

| | | |
|---|---|---|
| DE | 102014115377 B4 | 9/2019 |
| EP | 0715391 B1 | 3/1999 |
| EP | 3504408 A1 | 7/2019 |
| EP | 3650769 B1 | 10/2021 |
| SE | 1651712 A1 | 6/2018 |
| WO | 2017/213573 A1 | 12/2017 |
| WO | 2018/038662 A1 | 3/2018 |

OTHER PUBLICATIONS

Written Opinion and International Search Report for Int'l. Patent Appln. No PCT/US2021/044922, dated Dec. 10, 2021 (11 pgs).

\* cited by examiner

THERMAL MANAGEMENT SYSTEM FOR AN ENERGY STORAGE CONTAINER

TECHNICAL FIELD

The present disclosure relates generally to a thermal management system, and, in particular, to a thermal management system for managing a thermal load of power electronics within an energy storage container.

BACKGROUND

Diesel fuel is typically used to power land drilling rigs. Natural gas is an attractive alternative due to lower emissions, lower cost, and widespread availability of natural gas produced at drilling sites. Unlike diesel powered generator sets (gensets), however, transient response of natural gas genset is inadequate to accept large load changes on a drilling rig unless combined with an energy storage system. Back-up energy sources may be used in other applications, such as remote medical facilities or in vehicles. A back-up energy source, made of, for example, lithium ion batteries, is used to supplement power supplied to the drilling rig when natural gas engines are unable to accept the load. The back-up energy source may be stored in a housing, such as a 20 foot container. Power electronics, such as an inverter, may also need to be stored in the housing to prevent internal components from corroding due to humid ambient conditions. The back-up energy source and the power electronics require cooling systems to provide thermal management, e.g., cooling of air or coolant around the energy source and the power electronics, because the energy source and/or the power electronics may not function properly outside a given temperature range, and, as noted, in extreme temperature and humidity conditions, the energy source and/or the power electronics may be damaged. That is, energy storage systems having such back-up energy sources and power electronics require efficient thermal management for safe and reliable operation of the energy storage system.

As an example of a cooling system for an electronic power unit, International Patent Application Publication No. WO2018/038662 (the "'662 publication") describes a cooling system for a hybrid vehicle, the system having a high temperature circuit for cooling of power electronics, and a low temperature circuit for cooling of electrical energy storage during operation of the vehicle. During a rapid charging process, more heat energy is generated in the electric energy storage than during operation of the vehicle, and, as a result, the low temperature circuit is usually unable to sufficiently cool the electrical energy storage during the rapid charging process. Since the power electronics do not require cooling during the rapid charging process, a radiator of the high temperature circuit may be used in addition to a radiator in the low temperature circuit in a modified flow circuit to cool the coolant in the low temperature circuit to a necessary low temperature to cool the electrical energy storage and thereby prevent damage to the electrical energy storage. This modified flow circuit thus cools the coolant using two radiators to increase the cooling capacity of the system. The system described in the '662 publication thus provides for a cooling system capable of switching to a modified flow circuit during a rapid charging process.

Energy storage containers may be used in commercial and industrial applications for peak shaving, load shifting, emergency backup, and various grid services. Such energy storage containers require cooling systems capable of cooling electrical energy storage greater in size and energy output as compared to the electrical energy storage of a hybrid vehicle. Further, such energy storage containers may be located and operate within a wide range of temperatures, e.g., in extreme temperature conditions, and, therefore, require cooling systems capable of efficient thermal management in such conditions.

The thermal management system of the present disclosure may solve one or more of the problems set forth above and/or other problems in the art. The scope of the current disclosure, however, is defined by the attached claims, and not by the ability to solve any specific problem.

SUMMARY

In one aspect, a thermal management system for an energy storage container includes an enclosed compartment containing an energy storage unit, an air temperature control unit configured to cool an interior of the enclosed compartment, and at least one inverter connected to a coolant circuit, which is separate from the air temperature control unit, and configured to be cooled by a coolant in the coolant circuit. The thermal management system also includes a radiator located outside of the enclosed compartment, the radiator being connected to the coolant circuit, and the coolant in the coolant circuit flowing through the radiator, and at least one fan located alongside the radiator, outside of the enclosed compartment, the at least one fan being configured to blow air across the radiator to cool the coolant flowing through the radiator.

In another aspect, a thermal management system includes a housing having an insulated compartment containing an energy storage unit, an air temperature control unit configured to cool an interior of the insulated compartment, and a power electronics cabinet containing at least one inverter. The power electronics cabinet is connected to a coolant circuit, which is separate from the air temperature control unit, and which cools the power electronics cabinet. The thermal management system further includes a side compartment, located alongside the insulated compartment, the side compartment containing a radiator located within a radiator opening in the side compartment, and at least one fan located alongside the radiator, the at least one fan being configured to blow air across the side compartment.

In still another aspect, a thermal management system, for thermal management of a power electronics storage unit, includes an enclosed compartment containing the power electronics storage unit, which contains at least one inverter, a radiator located outside of the enclosed compartment, at least one fan located alongside the radiator, outside of the enclosed compartment, the at least one fan being configured to blow air across the radiator, and a coolant circuit that extends through the power electronics storage unit and is connected to the radiator, wherein a coolant in the coolant circuit flows through the radiator and is cooled by the air blown across the radiator by the at least one fan.

DETAILED DESCRIPTION

Both the foregoing general description and the following detailed description are exemplary and explanatory only and are not restrictive of the features, as claimed. As used herein, the terms "comprises," "comprising," "having," including," or other variations thereof, are intended to cover a non-exclusive inclusion, such that a process, method, article, or apparatus that comprises a list of elements does not include only those elements, but may include other elements not expressly listed or inherent to such a process, method, article, or apparatus. In addition, in this disclosure, relative terms, such as, for example, "about," "generally, "substantially," and "approximately" are used to indicate a possible variation of ±10% in the stated value.

Figure 1:
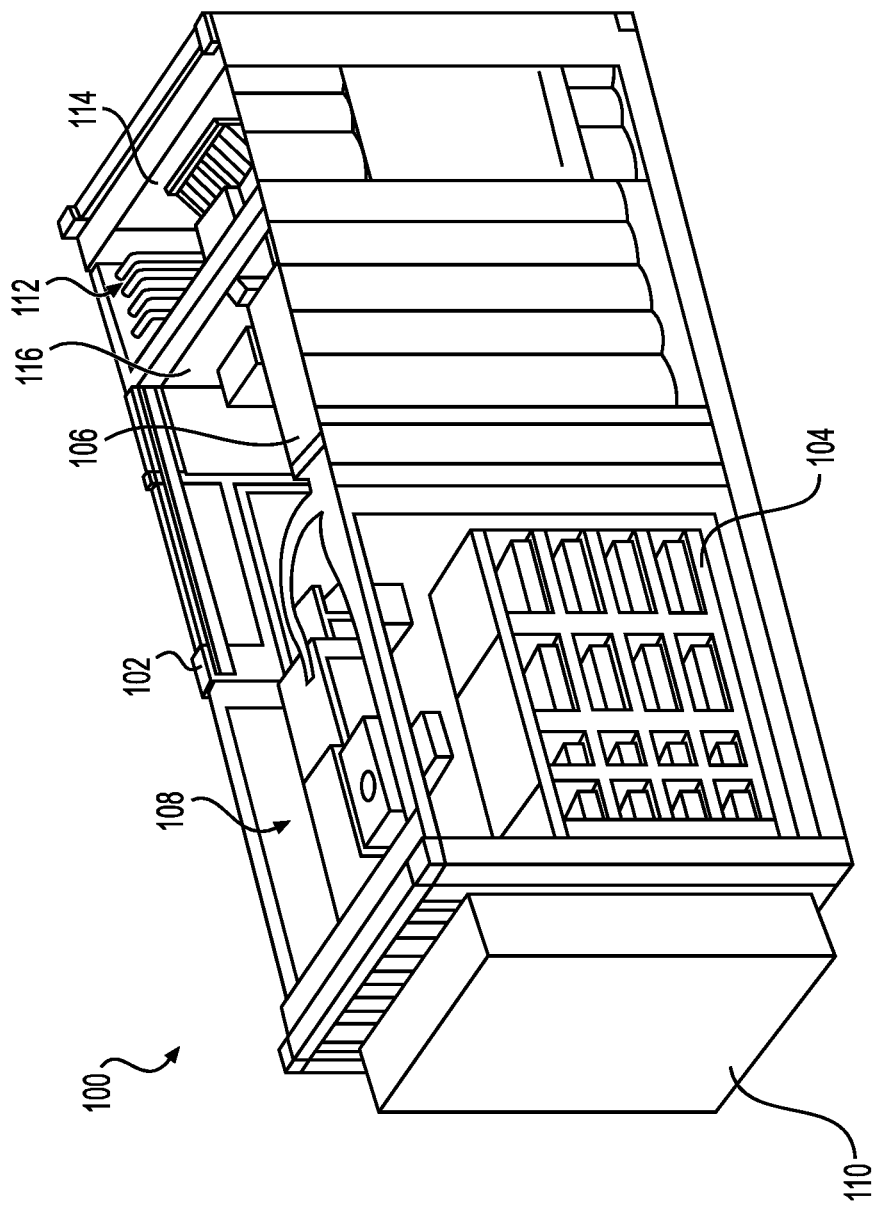
FIG. 1 shows a schematic view of a thermal management system, including a storage container that stores a back-up energy system and power electronics, in accordance with the present disclosure.

FIG. 1 shows a schematic view of a thermal management system 100 of the present disclosure. The thermal management system 100 includes an energy storage container 102 (hereafter, storage container 102) that houses an energy storage unit 104 and a power electronics cabinet 106 in a main compartment 108. The main compartment 108 also has an air temperature control unit, such as a heating, ventilation, and air conditioning (HVAC) unit 110 that heats or cools air, and circulates the heated or cooled air throughout the main compartment 108. The storage container 102 also has a side compartment 112, adjacent to the main compartment 108, which includes a transformer bay 114. The main compartment 108 and the side compartment 112 are separated by a wall 116.

Figure 2:
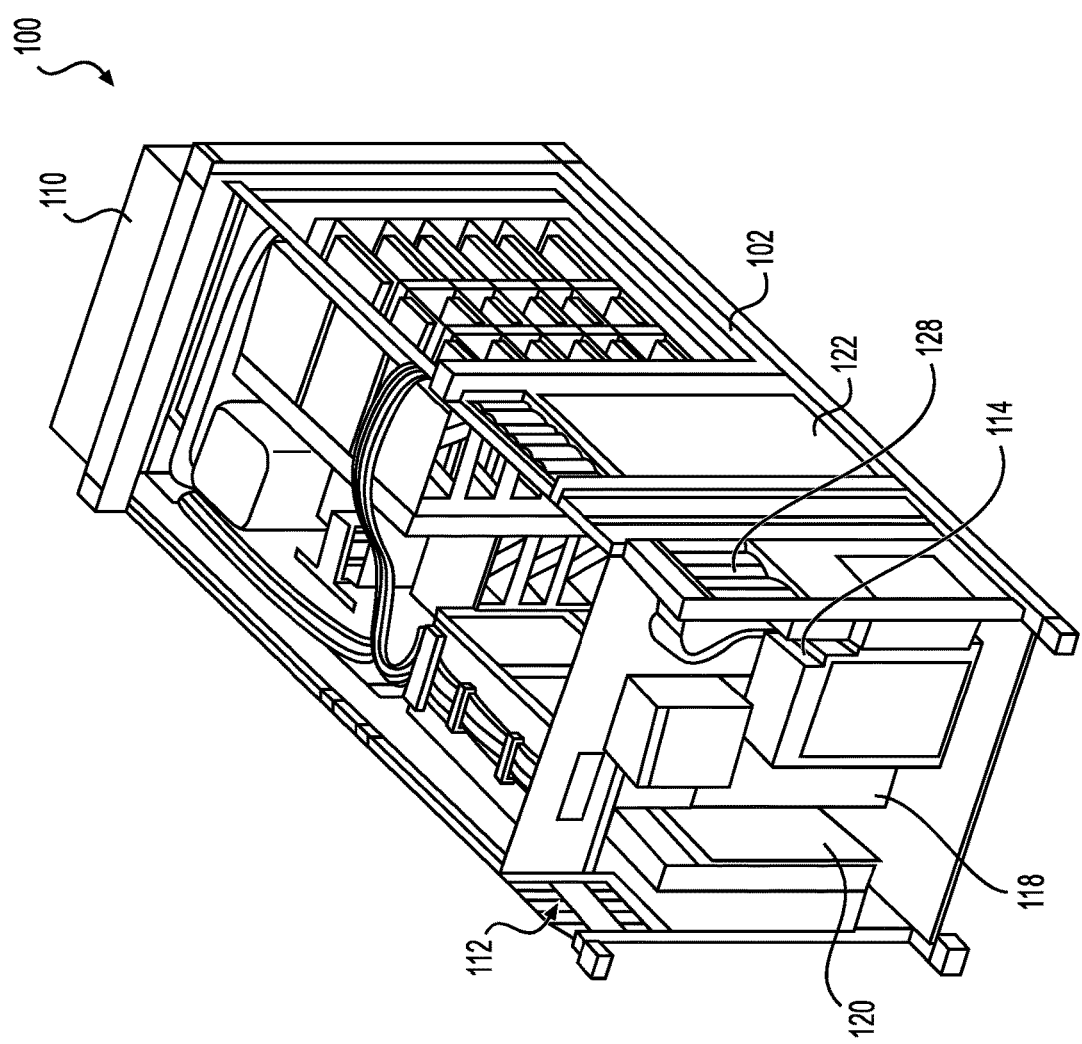
FIG. 2 shows another schematic view of the thermal management system shown in FIG. 1.

FIG. 2 shows another schematic view of the thermal management system 100. In particular, FIG. 2 shows an interior of the side compartment 112, including the transformer bay 114 in which one or more transformers 118 (shown in FIG. 3) are installed, and a radiator 120. The transformers 118 may include, for example, a step down transformer, which reduces a voltage from 600 V to 480 V, and a shore power transformer that outputs 208 V. The transformers 118 are not, however, limited to these examples, and may be other types of transformers, such as a step up transformer. The storage container 102 may also have one or more doors 122 for access to the main compartment 108 and/or the side compartment 112 for maintenance and operation purposes.

Figure 3:
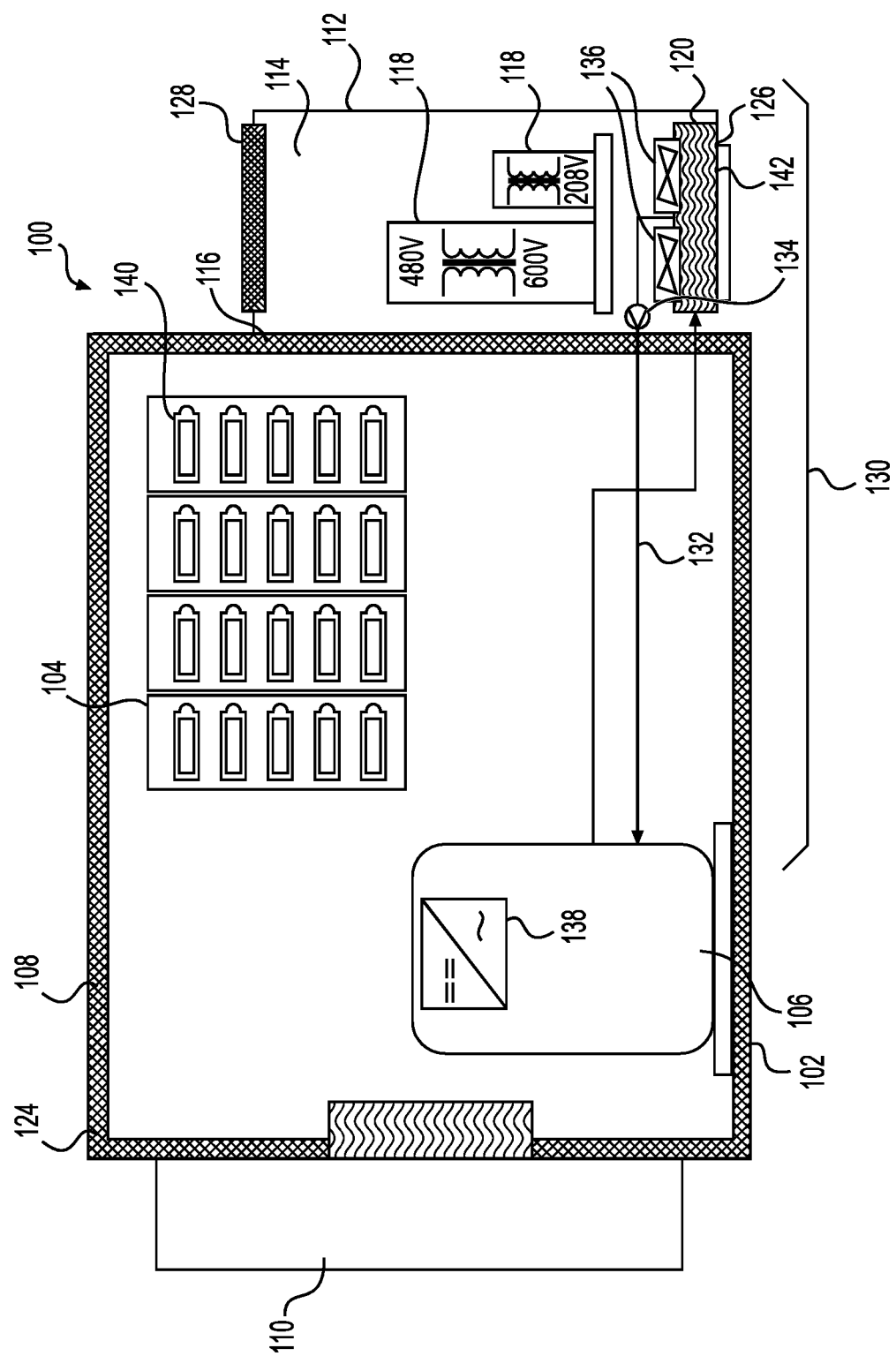
FIG. 3 shows a schematic diagram of the thermal management system shown in FIGS. 1 and 2.

FIG. 3 shows a schematic diagram of the thermal management system 100 shown in FIGS. 1 and 2. The main compartment 108 may have a layer of insulation 124 around an outer perimeter thereof. The layer of insulation 124 reduces a load on the HVAC unit 110, in terms of usage during a cooling process, as discussed in more detail below. The side compartment 112 may have a radiator opening 126 on a side of the container 102, and a louvered opening 128, also shown in FIG. 2, on an opposing side of the container 102, as shown in FIG. 3. The louvered opening 128 may include louvers and filters, through which air can flow.

The thermal management system 100 also includes a cooling system 130 including a conduit 132. A coolant flows through the conduit 132, and may be, for example a 50%-50% water-glycol mixture, although other types of coolant may be used. The cooling system 130 also includes a pump 134, the radiator 120, and one or more fans 136, all of which are located in the side compartment 112. The cooling system 130 is connected to the power electronics cabinet 106, which may store one or more inverters 138, which convert direct current (DC) power from batteries 140, as a back-up energy source, to alternating current (AC) power to be supplied to other power electronics (not shown) associated with the energy storage container thermal management system 100.

With reference to FIG. 3, the energy storage unit 104 stores the batteries 140 as a plurality of back-up energy sources. The batteries 140 may be arranged and connected in series and/or in parallel. The batteries 140 may be, for example, lithium ion batteries, and may be rated to operate within an operation temperature range of, for example, 10° C. to 30° C. at a pressure of 120 kPa. The batteries 140 may be liquid-cooled or air-cooled. In particular, for example, the batteries 140 may be cooled by air within the storage container 102, which is cooled by the HVAC unit 110. In addition to supplying power to the power electronics via the inverter 138, the batteries 140 supply power to a machine via a power supply line (not shown).

Again with reference to FIG. 3, the components of the cooling system 130 are described in detail. The pump 134 may be located in the side compartment 112, and may be a centrifugal pump, although other types of pumps may be used. The pump 134 maintains a pressure of the coolant in the cooling system 130 at, for example, 190 kPa. The power electronics cabinet 106 is downstream of the pump 134, and within the main compartment 108. And, as noted above, for example, the power electronics cabinet 106 contains one or more inverters 138 that convert DC power from the batteries 140 to AC power. The one or more inverters 138 are not, however, limited to such an arrangement, and may convert AC power to DC power.

The radiator 120 is downstream of the power electronics cabinet 106, and is located in the side compartment 112, and outside of the main compartment 108 of the storage container 102. The radiator 120 may include one or more fins 142 that absorb heat (i.e., thermal energy) from the coolant passing through the radiator 120. The fans 136, located adjacent to the radiator 120, force air from outside (ambient air) of the side compartment 112 through the radiator 120, and across the transformer bay 114 to cool the transformers 118.

INDUSTRIAL APPLICABILITY

The thermal management system 100 of the present disclosure provides for efficient cooling of a storage container 102, and, in particular, of a power electronics cabinet 106 within the storage container 102, to maintain the power electronics cabinet 106 and the contents thereof below a maximum temperature threshold of, e.g., 80° C., when exposed to a wide range of ambient temperatures. In particular, by virtue of the HVAC unit 110, which cools the storage container 102, including the energy storage unit 104, and by virtue of the cooling system 130, including the radiator 120, which cools the power electronics cabinet 106 and the contents thereof, the thermal management system 100 of the present disclosure reduces a load, in terms of usage during a cooling process, on the HVAC unit 110. The reduction of the load of the HVAC unit 110 reduces the overall power consumption of the thermal management system 100, and increases the efficiency thereof. In addition, by positioning the radiator 120 outside of the main compartment 108 of the storage container 102, a size of the radiator 120 is not constrained by a size of the storage container 102. This arrangement thus allows for upsizing of the radiator 120, which allows for removal of relatively more heat from the power electronics cabinet 106, and, in turn, results in improved efficiency of the one or more inverters 138 and other power electronics stored in the power electronics cabinet 106.

When the thermal management system 100 is in use, the pump 134 circulates the coolant in the conduit 132 of the cooling system 130. The coolant flows from the pump 134 into the main compartment 108, to the power electronics cabinet 106, and absorbs heat from air inside of the power electronics cabinet 106, thereby cooling the inverter 138 and other power electronics stored therein. The warmed coolant then flows from the power electronics cabinet 106 out of the main compartment 108, to the side compartment 112, and into the radiator 120. The coolant that passes through the radiator 120 is cooled by the fins 142 of the radiator 120, which absorb heat from the coolant, and air passing across the fins 142. The air is forced across the fins 142 from outside of the side compartment 112 by the fans 136. The coolant then flows back to the pump 134. And, as noted above, because the radiator 120 is located in the side compartment 112, a size of the radiator 120 may be increased, which, in turn, allows for upsizing a size of the radiator and, therefore, increasing a cooling capacity of the radiator 120.

The fans 136 force air from outside of the side compartment 112 across the radiator 120, and across the transformer bay 114. The air forced across the transformer bay 114 cools the transformers 118, as well as the accompanying high voltage cabling and wiring systems (not shown). The air then passes through the louvered opening 128 and outside of the side compartment 112. With this arrangement, a temperature of the coolant in the cooling system 130 that flows to the power electronics cabinet 106 can be maintained at 30° C. or less to ensure sufficient cooling of the inverter 138 and other power electronics stored in the power electronics cabinet 106. A temperature of air flowing into the radiator 120 may be approximately 25° C., and air flowing from the radiator 120 may be approximately 35° C. Air at a temperature of approximately 35° C. is sufficient for use in cooling the transformers 118. Air at even greater temperatures may also be sufficient to cool the transformers, because ambient temperatures throughout North America, for example, generally do not exceed 50° C.

The thermal management system 100 of the present disclosure provides for cooling of components within a storage container 102, and, in particular, a power electronics cabinet 106, in a relatively efficient manner and in a wide range of ambient temperatures. Because the one or more inverters 138 and other power electronics are stored within the power electronics cabinet 106, which is within the storage container 102, they are protected from damage caused by pollution and/or the elements, e.g., corrosion due to humidity. And, because the cooling system 130 cools the power electronics cabinet 106, high temperatures within the power electronics cabinet 106 can be prevented. As a result, performance of the one or more inverters 138 and the other power electronics can be optimized. In addition, by virtue of the radiator 120 and the fans 136, air cools the coolant in the cooling system 130, as well as the one or more transformers 118 in the transformer bay 114. Because air is used to cool the one or more transformers 118 (that is, forced-air cooling of the transformers 118 is enabled), a size of the transformers 118 is not limited, and can be increased without requiring additional cooling components, which would incur greater costs and reduce an overall efficiency of the thermal management system 100. And, because air is used to cool the transformers 118, an overall space claimed by a transformer of a given rating can be reduced. Further, by virtue of the radiator 120 being located outside of the insulated main compartment 108 and being used to cool the power electronics cabinet 106, a load on the HVAC unit 110 can be reduced, as the warm air within the power electronics cabinet 106 does not require cooling by the HVAC unit 110.

As a result, a size of the HVAC unit 110 can be reduced, which reduces the overall power consumption of the thermal management system 100, reduces a cost associated with use thereof, and increases an efficiency thereof.

It will be apparent to those skilled in the art that various modifications and variations can be made to the disclosed energy storage and thermal management system without departing from the scope of the disclosure. Other embodiments of the energy storage and thermal management system will be apparent to those skilled in the art from consideration of the specification and the accompanying figures. It is intended that the specification, and, in particular, the examples provided herein be considered as exemplary only, with a true scope of the disclosure being indicated by the following claims and their equivalents.

We claim:

1. A thermal management system for an energy storage container, comprising:
    an enclosed compartment containing:
        an energy storage unit;
        an air temperature control unit configured to cool an interior of the enclosed compartment, including the energy storage unit; and
        at least one inverter configured to be cooled by a coolant in a coolant circuit;
    the coolant circuit located partially within the enclosed compartment and partially outside of the enclosed compartment, the coolant circuit being separate from the air temperature control unit, and containing the coolant;
    a radiator located outside of the enclosed compartment, the radiator being connected to the coolant circuit, wherein the coolant in the coolant circuit flows through the radiator; and
    at least one fan located alongside the radiator, outside of the enclosed compartment, the at least one fan being configured to blow air across the radiator to cool the coolant flowing through the radiator.

2. The thermal management system of claim 1, wherein the enclosed compartment is insulated.

3. The thermal management system of claim 1, wherein the radiator and the at least one fan are located within a transformer bay alongside the enclosed compartment, the transformer bay housing at least one power transformer.

4. The thermal management system of claim 3, wherein the at least one fan blows air across the transformer bay to cool the at least one power transformer.

5. The thermal management system of claim 1, wherein the radiator and the at least one fan are located in a side compartment having an opening on one end, in which the radiator is positioned, and a louvered opening on an opposite end.

6. The thermal management system of claim 5, wherein the at least one fan draws ambient air through the opening and forces the air across the side compartment through the louvered opening.

7. The thermal management system of claim 1, further comprising a pump, located outside of the enclosed compartment, the pump being connected to the coolant circuit and configured to circulate the coolant in the coolant circuit.

8. A thermal management system, comprising:
    a housing having:
        an insulated compartment containing:
            an energy storage unit;
            an air temperature control unit configured to cool an interior of the insulated compartment; and a power electronics cabinet containing at least one inverter, the inverter being configured to be cooled by a coolant in a coolant circuit; and a side compartment, located alongside the insulated compartment, the side compartment containing:
 a radiator located within a radiator opening in the side compartment; and
 at least one fan located alongside the radiator, the at least one fan being configured to blow air across the side compartment; and the coolant circuit located partially within the insulated compartment and partially within the side compartment, the coolant circuit being connected to the radiator, and circulating the coolant through the power electronics cabinet and the radiator.

9. The thermal management system of claim 8, wherein the side compartment includes a transformer bay housing at least one power transformer.

10. The thermal management system of claim 9, wherein the at least one fan blows air across the transformer bay to cool the at least one power transformer.

11. The thermal management system of claim 8, wherein the side compartment has an opening on one end, in which the radiator is positioned, and a louvered opening on an opposite end.

12. The thermal management system of claim 11, wherein the at least one fan draws ambient air through the opening and forces the air across the side compartment through the louvered opening.

13. The thermal management system of claim 8, further comprising a pump, located in the side compartment, the pump being connected to the coolant circuit and configured to circulate the coolant in the coolant circuit.

14. A thermal management system for thermal management of a power electronics storage unit, the thermal management system comprising:
 an enclosed compartment containing the power electronics storage unit, which contains at least one inverter;
 a radiator located outside of the enclosed compartment;
 at least one fan located alongside the radiator, outside of the enclosed compartment, the at least one fan being configured to blow air across the radiator; and
 a coolant circuit including a first portion located within the enclosed compartment and extending through the power electronics storage unit, and a second portion located outside of the enclosed compartment and being connected to the radiator, wherein a coolant in the coolant circuit flows through the radiator and is cooled by the air blown across the radiator by the at least one fan.

15. The thermal management system of claim 14, further comprising:
 an energy storage unit located within the enclosed compartment; and
 an air temperature control unit configured to cool an interior of the enclosed compartment, the air temperature control unit being separate from the coolant circuit.

16. The thermal management system of claim 15, wherein the enclosed compartment is insulated.

17. The thermal management system of claim 14, wherein the radiator and the at least one fan are located within a transformer bay alongside the enclosed compartment, the transformer bay housing at least one power transformer.

18. The thermal management system of claim 17, wherein the at least one fan blows air across the transformer bay to cool the at least one power transformer.

19. The thermal management system of claim 14, wherein the radiator and the at least one fan are located in a side compartment having an opening on one end, in which the radiator is positioned, and a louvered opening on an opposite end.

20. The thermal management system of claim 19, wherein the at least one fan draws ambient air through the opening and forces the air across the side compartment through the louvered opening.

\* \* \* \* \*